United States Patent
Shapiro

[11] Patent Number: 5,873,511
[45] Date of Patent: Feb. 23, 1999

[54] APPARATUS AND METHOD FOR FORMING SOLDER BONDING PADS

[76] Inventor: Herbert M. Shapiro, 29091 Pompano Way, Liguna Niguel, Calif. 92677

[21] Appl. No.: 877,270

[22] Filed: Jun. 17, 1997

Related U.S. Application Data

[63] Continuation-in-part of Ser. No. 854,064, May 8, 1997.

[51] Int. Cl.[6] .................................................. H01L 21/60
[52] U.S. Cl. ........................ 228/33; 228/254; 219/121.65
[58] Field of Search ............................... 228/33, 41, 56.3, 228/180.22, 254; 427/96, 123; 219/121.65, 121.66, 121.78

[56] References Cited

U.S. PATENT DOCUMENTS

| | | | |
|---|---|---|---|
| 5,153,408 | 10/1992 | Handford et al. | 219/121.64 |
| 5,323,947 | 6/1994 | Juskey et al. | 228/56.3 |
| 5,416,969 | 5/1995 | Miura | 228/257 |
| 5,442,852 | 8/1995 | Danner | 228/180.21 |
| 5,565,119 | 10/1996 | Behun et al. | 228/1.1 |

*Primary Examiner*—Samuel M. Heinrich
*Attorney, Agent, or Firm*—Herbert M. Shapiro

[57] ABSTRACT

The placement of solder "balls" in a Ball Grid Array is accomplished by placing a solder strip in contact with the top surface of the ball grid array carrier. The pulsing of a laser directed at the solder in discrete positions permits the transfer of the solder to the gold dot, of the array of dots, on the carrier in registry with the laser output when activated. Selective solder placement is possible and increasingly higher throughput is achieved by the use of laser diode bars or optical fiber fans to effect solder transfer to a plurality of dots of the array simultaneously. The entire process can be automated by making the solder strip continuous through a recycling station arranged along a path along which the solder strip moves to the position where the carrier and the solder strip are moved into juxtaposition. The use of a transparent strip with a pattern of holes filled with solder paste permits easy transfer of the solder to the gold dots or islands on the carrier in registry with laser beam.

12 Claims, 4 Drawing Sheets

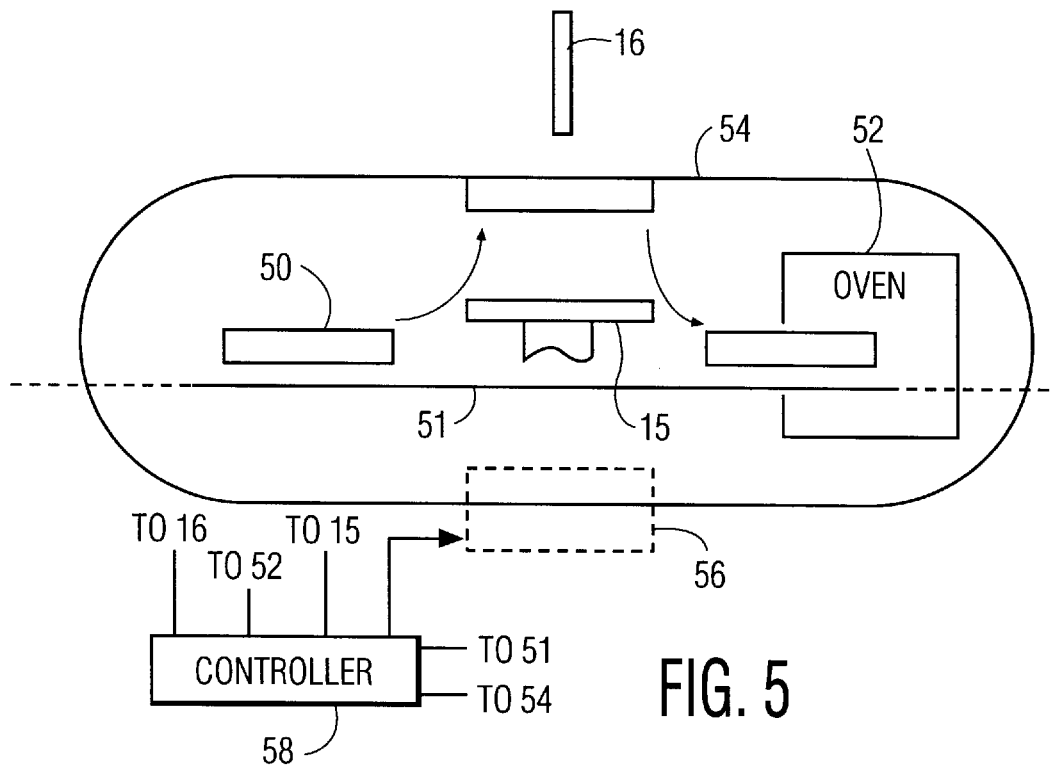
FIG. 4
FIG. 5
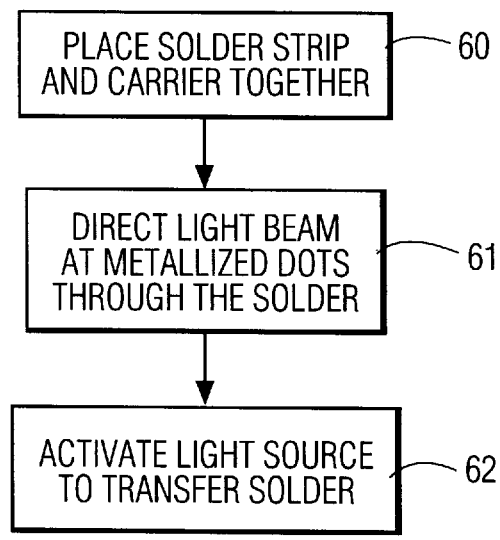
FIG. 6

APPARATUS AND METHOD FOR FORMING SOLDER BONDING PADS

REFERENCE TO RELATED APPLICATIONS

This application is a continuation in part of patent application Ser. No. 08/845,064 Filed May 8, 1997, for the present applicant and entitled: APPARATUS FOR POPULATING A BALL GRID ARRAY CARRIER

FIELD OF THE INVENTION

This invention relates to semiconductor packages and more particularly to apparatus for attaching semiconductor devices to metallic islands on a carrier through which signals are supplied to the device.

BACKGROUND OF THE INVENTION

Semiconductor devices typically comprise a plurality of components formed by photolithographic processes in a multilayered structure. The structure is supplied with signals typically via a sunburst pattern which makes electrical contact to lands on the semiconductor device. For completing the packaging of the device, the sunburst pattern is connected to external signal and power sources for the device to operate and the device is protected from the environment.

One attractive technology for completing the semiconductor package is termed a "Ball Grid Array" (BGA). The BGA comprises a planar component "carrier" which may comprise a rigid plastic layer with metallic (gold) islands or dots on the top surface. The dots are connected to lands on the bottom surface of the carrier by through connections which provide electrical continuity from the power and signal sources to the metallic dots. The BGA, thus, is employed as a support or carrier for the semiconductor device and as a medium for providing the requisite drive and signals to the attached semiconductor device.

The semiconductor device, accordingly, has to be connected to the carrier in a manner to permit electrical continuity. To this end, it is necessary to provide solder on top of each of the gold dots on the top surface of the carrier to bond the semiconductor securely in place. This has been accomplished typically by apparatus which places a pattern of tiny solder balls on top of the gold dots. U.S. Pat. No. 5,431,332 issued Jul. 11, 1995 and U.S. Pat. No. 5,551,216 issued Sep. 3, 1996 disclose techniques for the placement of such solder balls. Each of these patents discloses a technique where a tooling plate or stencil with an array of apertures, which matches the array of gold dots, is filled with tiny solder balls and is then juxtaposed with the carrier to transfer the balls to the carrier. The carrier has a coating of adhesive to hold the balls in place and the carrier is then heated to affix the balls permanently.

The apparatus to place the balls on the carrier is expensive and not sufficiently fast to meet present throughput requirements inexpensively. Further, the apparatus is not easily adapted to increasingly fine resolution to meet projected semiconductor packaging requirements. Also, solder balls are presently so small that they frequently become lodged in undesirable positions in the apparatus necessitating frequent inspection and down time.

BRIEF DESCRIPTION OF THE INVENTION

In accordance with the principles of this invention, a solder strip is placed in contact with the carrier on which the gold dot array is formed. A laser is scanned over the surface of the solder strip and pulsed in registry with the position of each of the gold dots. The solder is liquefied where impacted by the laser beam and thus, solder is transferred to the dots.

The laser can be raster scanned over the carrier and pulsed at each position of a gold dot or a laser diode array can be used to supply a pulse to the solder strip over each row of gold dots simultaneously. Also, a fiber fan can be used to supply pulses, a row at a time, from a single laser diode source. The adhesive over the carrier, as is presently used, may be useful for adhering the solder until it is heated for permanent attachment but does not seem to be necessary in prototype device packages.

The technique is also useful for BGA carriers comprising flexible plastic films with ceramic wafers attached to the underside thereof covering conductor lands and through connections to the gold dot arrays.

The technique has the further advantage that universal BGA carriers can be made with solder provided only where necessary on selected ones of the gold dots. At present, there is no capability for populating with solder balls fewer than all the dots in an array except by mistake.

BRIEF DESCRIPTION OF THE DRAWINGS

FIG. 4 is a schematic view of an alternative solder source for the apparatus of FIG. 1;

FIG. 5 is a schematic block diagram of an automated line for the apparatus of FIG. 1;

FIG. 6 is a flow diagram of the method for operating the apparatus of FIG. 1.

DETAILED DESCRIPTION OF ILLUSTRATIVE EMBODIMENTS OF THE INVENTION

Figure 1:
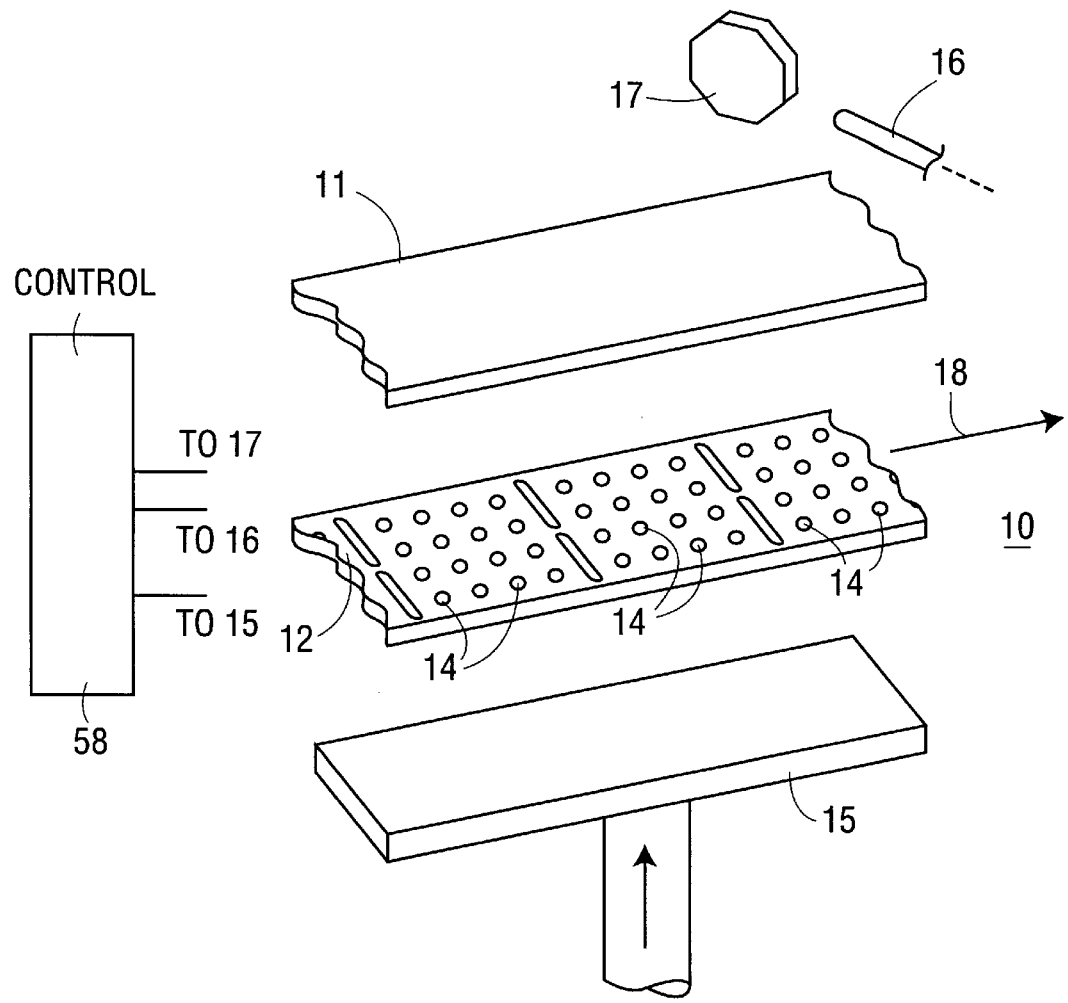
FIG. 1 is an exploded view of apparatus in accordance with the principles of this invention.

FIG. 1 is a schematic exploded view of apparatus 10 in accordance with the principles of this invention. The apparatus comprises a strip of solder 11 having a width to extend over the width of a BGA carrier 12 and having a thickness to correspond to the diameter (0.015 to 0.130 inch) of presently available solder balls.

The figure shows solder strip 11 spaced apart from carrier 12 to illustrate the array of metallized (gold) dots 14 on the top surface of the carrier. In operation, the carrier is moved into juxtaposition with solder strip 11 by riser 15. Then, laser diode 16 is activated to generate a light pulse in registry with the pattern of gold dots to transfer solder to the gold dots. To this end, the laser output, in one embodiment, is scanned over the array of gold dots, for example, by a spinning polygon mirror 17 in a manner similar to that used in a laser printer, line by line, as the solder strip and the carrier are moved incrementally to permit successive lines of dots to be solder coated. The movement of the solder strip and the carrier is indicated by arrow 18.

Once solder is provided on the dots of the array, the carrier may be removed from the solder strip and the solder recycled so that a new solder strip can be extruded.

In the event that it is desired to move only the carrier with respect to the solder strip, or vice versa, the carrier and the solder strip may be spaced apart slightly, say, by the thickness of the solder film (0.015 to 0.030 inch). The solder strip, in such an embodiment, may be formed on a glass slide to ensure that the solder film remains planar and rigid.

Figure 2:
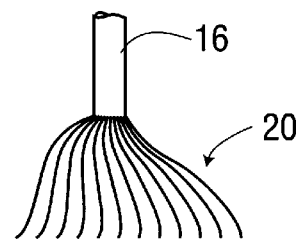
FIGS. 2 and 3 are schematic views of alternate heat sources for the apparatus of FIG. 1.
Figure 3:

FIG. 2 illustrates a laser diode (16) with a fan 20 of optical fibers for delivering light to a row of dots on a carrier surface. In such an embodiment, a laser pulse causes solder to be deposited on all the dots of a row. FIG. 3 illustrates a laser bar 30 with a linear array of laser diodes. The lasers of bar 30 may be activated selectively and thus can be operated to deposit solder on selected dots of a line of gold dots. The selective option is also possible with the embodiment of FIG. 1 where the polygon mirror scans the laser beam to consecutive dot positions in a raster pattern where the presence or absence of a pule in each position determines whether or not solder is deposited.

FIG. 4 illustrates a solder film 40 on the underside of a glass slide 41 for ensuring a rigid planar geometry to the solder layer in embodiments where the solder layer is spaced apart from the carrier.

FIG. 5 illustrates a manufacturing line wherein successive carriers 50 are moved along a conveyer belt to the position of riser 15. Riser 15 is operative, as described hereinbefore, to move the carrier into juxtaposition with the solder strip. Thereafter, the carrier is lowered and moved to the right, as viewed, into an oven 52.

The solder strip can be arranged in a continuous strip and recycled at means 56 to reconstitute the strip for further use. Operation of the line is under the control of controller 58.

The use of a laser permits high speed operation allowing a significant increase in throughput over prior art ball placement apparatus now in commercial use. Moreover, the simplicity of the system permits the cost of the system to be nearer to the cost of a laser printer compared to the significantly higher cost of presently available BGA apparatus.

Further, since the diameter of the output beam from a laser is small, the resolution of apparatus, in accordance with the principles of this invention, is greater than that which could be achieved easily with present BGA apparatus.

FIG. 6 is a flow diagram of the method practiced by the apparatus of FIG. 1. First, a solder strip and a BGA carrier are brought together as indicated by block 60. Next, the (coherent) light source is directed at a metallized dot (or dots) on the surface of the carrier as represented by block 61. The source is then activated to transfer solder to the dot (or dots) in registry with the beam (or beams) of light as indicated by block 62.

In one specific embodiment, a layer of solder 0.030 inch thick, adhered to a standard microscope slide, was placed in contact with a standard work piece (carrier) on which a pattern of metallic (gold) islands was formed normally for placement of solder balls. Various selected sites on the solder layer were melted by directing a 15 watt turnkey laser, at a wavelength of about 800 manometers operated at four watt output power, first for two seconds followed by a one half second pulse. The solder was transferred to the selected metal islands and there was no need for later heating to reflux the solder.

In another embodiment, a solder ribbon is used in the absence of a glass slide. In this embodiment, a laser bar is used to bond solder to selected ones, or all, of the sites of a row of islands simultaneously. The solder ribbon is simply peeled away from the carrier leaving solder in place at the selected islands.

This latter embodiment is easily automated by moving standard carriers along a conveyer belt in close proximity to the periphery of a "squirrel cage" type arrangement rotatable about an axis in synchronism with the movement of the conveyer belt. A (moving) solder ribbon is fed into the space between the periphery of the cage and the surface of the carrier. A laser bar, positioned at the axis of the squirrel cage, is activated to direct beams at the solder at positions in registry with selected islands on the carrier to bond the solder to the islands. The unbonded portions of the ribbon are removed from the carrier conveniently by elevating the path of the ribbon prior to and after the ribbon is urged into juxtaposition with the carrier by the squirrel cage.

Lasers are highly controllable and registry of the laser beams with the islands of a carrier is easily accomplished by the use of fiducials as is well understood in the art.

The invention was reduced to practice using a two millimeter thick stiff plastic sheet used to make projection transparencies. Holes were made in the plastic with a dental pick and the holes were filled with solder paste. The transparency was laid over a standard substrate with gold (metallic) islands on one side with through connections to metallic traces on the other. A laser was directed at a now paste filled holes in registry with an island on the carrier. The solder was transferred in about one-half second. The solder formed a mound on the island and required no reflux step.

The use of a sieve with a feature size (hole size) corresponding to the carrier island size (or much finer) permits a laser to be moved to preregistered positions to transfer solder from the previously paste filled holes in a "sieve". The sieve may be made in strips at a previous position along a conveyor belt, filled with solder paste at a next position and urged into juxtaposition with a carrier by a squirrel cage arrangement with a laser diode arrangement arranged along the plane of the axes of the squirrel cage in a manner to deliver the (4watts) power used to effect solder transfer.

Figure 7:
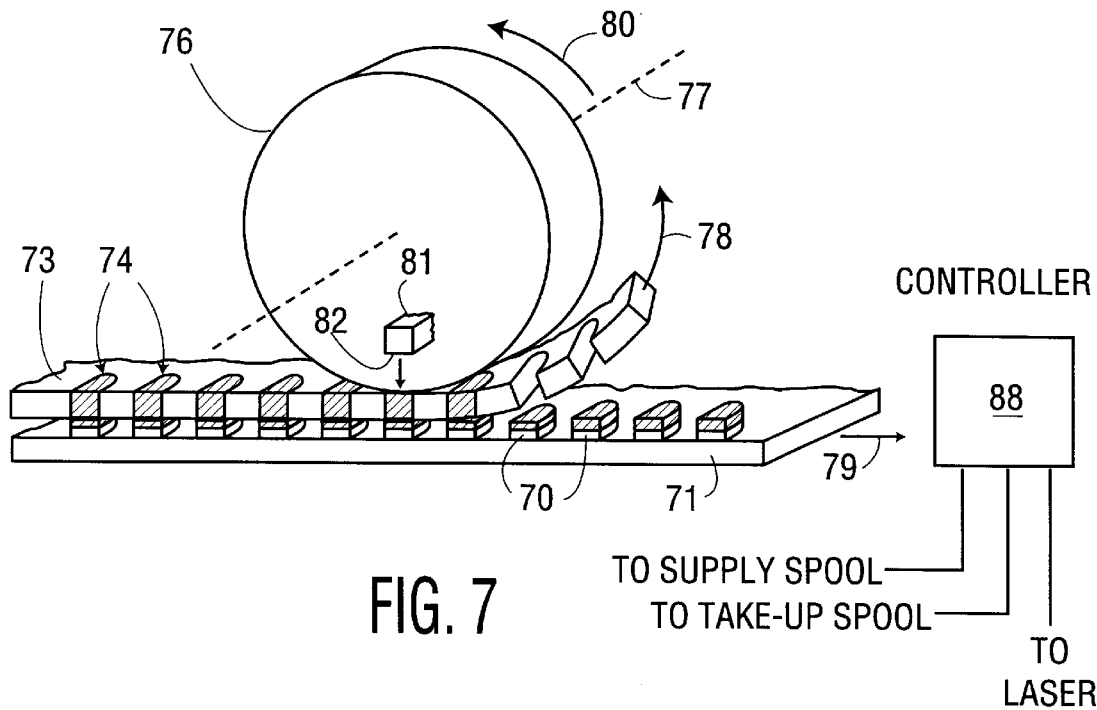
FIG. 7 is a schematic illustration of an alternative apparatus for the practice of the invention.
Figure 8:
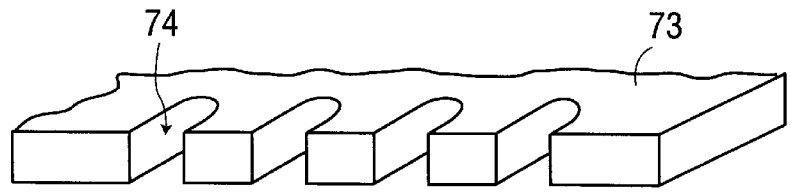
FIGS. 8–11 are schematic representatives of various components of FIG. 7 during the successive steps of the method practiced by the apparatus of FIG. 7.
Figure 9:
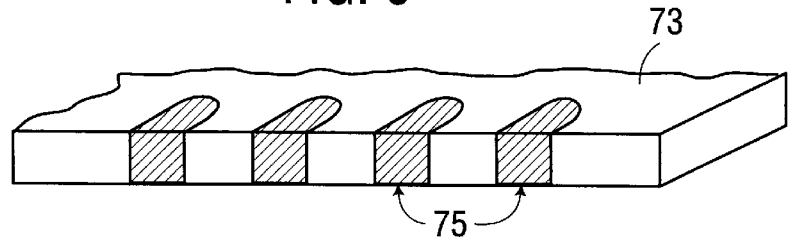

The carrier which can already come in strips can be moved along a conveyor belt to position islands thereon for solder transfer. FIG. 7 illustrates one arrangement by which solder is formed on islands 70 on a suitable substrate 71 such as used in ball grid array apparatus. The solder is carried into position by a transparent plastic strip 73 which has a pattern of holes 74 shown more clearly in FIG. 8. FIG. 9 shows the holes (74) filled with solder paste (75).

Figure 10:
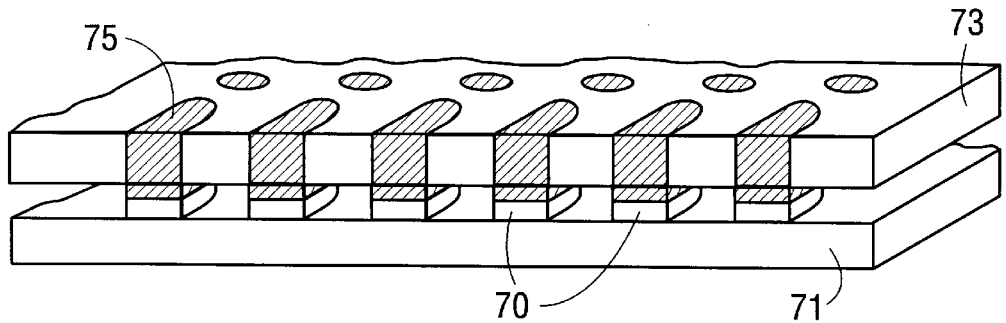
Figure 11:
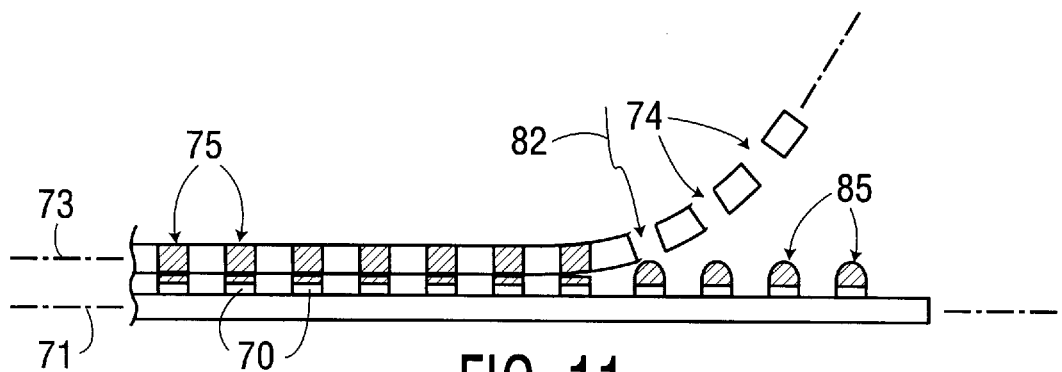

The strip (73) is urged into juxtaposition with substrate 71 by a friction wheel or by a squirrel cage type arrangement 76 rotatable about on axis 77. FIG. 10 illustrates the resulting relationship between substrate 71, strip 73, island 70, and solder 75. If we assume that strip 73 and substrate 71 are moving to the right as viewed in FIG. 7 and the squirrel cage is moving counter clockwise as represented by arrows 78, 79, and 80 respectively, a laser beam directed at the islands along the leading edge operates to transfer solder from holes 74 to islands in registry with those islands just prior to the separation of strip 73 from substrate 71 as illustrated in FIGS. 10 and 11. Specifically, a laser bar 81 (of FIG. 7) is positioned at the periphery of the squirrel cage to direct a light beam 82 at the holes (74) in strip 73 which are in registry with islands along the leading edge of substrate 71. The beams are operative to transfer solder to the islands as indicated at 85 in FIG. 11.

The laser bar is activated in synchronism with the advance of the substrate and strip to transfer solder to a row of islands simultaneously.

The substrate 71 and strip 73 may be moved in any straightforward manner such as from a feed spool to a take up spool (neither shown) as is clear from FIG. 7. The movements of the substrate and strip and the rotation of the squirrel cage are synchronized with the activation of the lasers of laser bar 81 in a well understood manner. The motors for driving the spools and for rotating the cage are under the control of a controller 88 shown in FIG. 7.

In an experimental arrangement strip 73 was made of a transparency used to make view graphs. A standard substrate with islands having diameters of 0.015 inch was used. A pattern of holes was made in the strip with a dental pick and the holes were filled with solder using a knife blade. Transfer of the solder to the islands was accomplished by laser pulses of four watts for about one-half second.

It is clear that an arrangement for transferring solder to metallic islands of a substrate in accordance with the principles of this invention is easily automated. A pattern of holes in a plastic strip can be formed in a well understood manner as a strip is advanced. Also, a sieve of a material which is essentially transparent to the laser beam can be used. Further, the pattern of holes in the strip can be made much finer than the pattern of islands. Solder will still transfer to islands in registry with the laser beams.

The registration of the laser beams with the islands is straightforward. At the feature size now required commercially, the synchronization of the movement of the strip, substrate and squirrel cage with the laser activation should suffice. If not, fiducials on the substrate can be used with an appropriate sensor to ensure registration.

Figure 12:
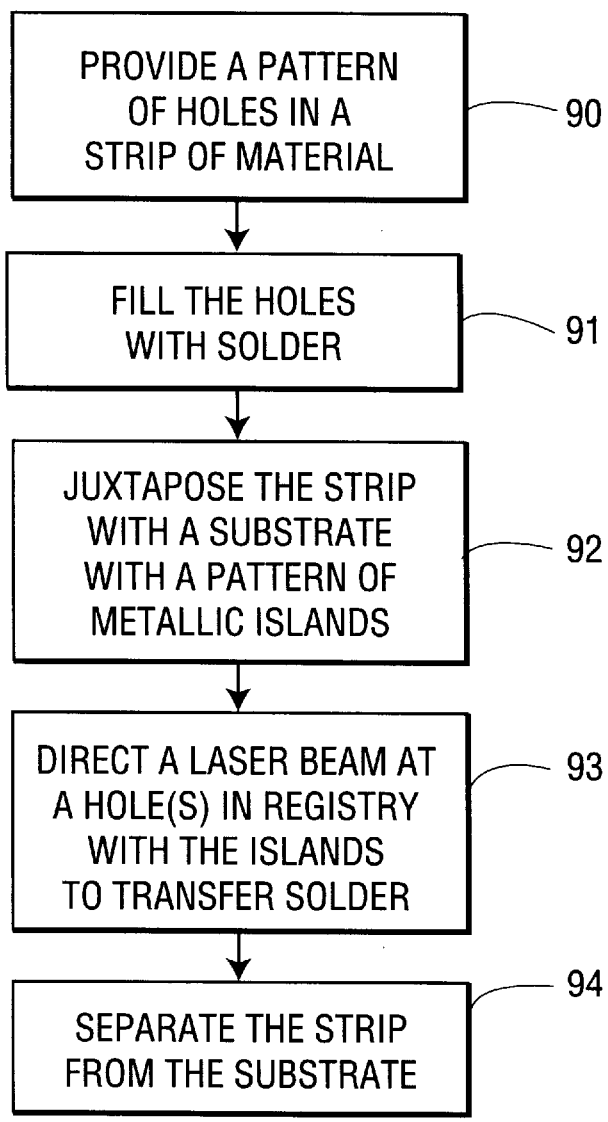
FIG. 12 is a flow diagram of the method practiced by the apparatus of FIG. 7.

FIG. 12 is a flow diagram of the method practiced by the apparatus of FIGS. 7 through 11. First, a pattern of holes is formed in a strip as indicated by block 90 and the holes are filled with solder as indicated by block 91. The strip is then moved into juxtaposition with a substrate with a pattern of islands on its surface as indicated by block 92. Laser beams are directed at the solder filled holes in registry with islands to transfer solder to those islands as indicated by block 93. The strip is then separated from the substrate in a manner to leave solder coatings on the islands as indicated by block 94.

Any means for moving strip 73 of FIG. 7 would be suitable. The squirrel cage is only illustrative. A sproket gear could be used if substrate 71 were adapted like a movie film real to include the familiar holes along the edges of the film. Also, a friction roller could be. The laser could be positioned separately next to the roller or between two spaced apart rollers.

The strip (73) also may be any material capable of having holes formed in it which could be filled with solder. A plastic transparency served nicely in this respect. A sieve also is suitable. The material should be essentially non absorbing of the laser radiation.

The pattern of holes in strip 73 may be made to match the pattern of islands on substrate 71 or can be made much finer. The laser beam can be directed to a sequence of positions corresponding to the pattern of islands and is operative to transfer solder, from a number of holes in a relatively finer pattern in the strip, to a relatively large area island corresponding to the position of the laser beam.

The laser beam diameter may be adjusted optically and can be used to transfer a solder spot on the order of tens of microns.

The cooling of the substrate was thought to be helpful in transferring the solder to an island destination. But this has been found unnecessary. Further, although the invention has been illustrated in terms of a laser diode light source, other focused sources of radiation may be suitable as long as they effect solder melting without effecting the solder carrier strip.

It is clear also that a solder carrier could be recycled by replacing solder in any empty holes in the carrier.

What is claimed is:

1. Apparatus for the placement of solder onto metallized dots of an array of dots on the surface of a carrier, said apparatus comprising means for placing a solder strip in close proximity with said surface, said apparatus including a source of coherent light and means for moving the light output from said source to selected positions on said solder strip in registry with said dots, and means for activating said source for transferring solder from said strip to the metallized dot in registry therewith.

2. Apparatus as in claim 1 wherein said solder strip is in contact with said surface.

3. Apparatus as in claim 1 wherein said solder strip is spaced apart from said surface a distance of from 0.015 to 0.030 inch.

4. Apparatus as in claim 1 wherein said source comprises a laser diode.

5. Apparatus as in claim 4 also including a mirror and means for rotating said mirror in synchronism with the activation of said laser for transferring solder to the metallized dots on said surface in registry with the position of said laser diode when pulsed.

6. Apparatus as in claim 4 also including a fiber optic fan coupled to said laser diode and operative to direct light in registry with a plurality of said diodes simultaneously.

7. Apparatus as in claim 3 wherein said solder strip is formed on the surface of a transparent member.

8. Apparatus as in claim 4 wherein said source comprises a laser bar including a plurality of laser diodes.

9. Apparatus for forming a layer of solder on metallic islands on a substrate, said apparatus comprising a layer of a transparent material having a pattern of holes therein, said holes occupying positions which correspond to the positions of said islands, means for filing said holes with solder, means for moving said layer into a position with respect to said substrate such that said holes are in registry with said islands, means for directing beams of radiation at said holes at an intensity and for a time to transfer solder from said holes to said islands, and means for separating said layer from said substrate.

10. Apparatus as in claim 9 wherein said layer is a transparent strip and said means for directing beams comprises a laser means.

11. Apparatus as in claim 10 wherein said strip and said substrate are formed as continuous strips and are urged into juxtaposition by a rotating wheel as the strips are advanced.

12. Apparatus as in claim 11 wherein said laser means comprises a laser bar positioned at the periphery of said wheel.

* * * * *